(12) United States Patent
Schmitt et al.

(10) Patent No.: US 7,164,292 B2
(45) Date of Patent: Jan. 16, 2007

(54) REDUCING ELECTRICAL NOISE DURING BUS TURNAROUND IN SIGNAL TRANSFER SYSTEMS

(75) Inventors: Ralf Schmitt, Mountain View, CA (US); Xingchao Yuan, Palo Alto, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 10/866,157

(22) Filed: Jun. 12, 2004

(65) Prior Publication Data
US 2005/0275424 A1    Dec. 15, 2005

(51) Int. Cl.
*H03K 19/0175*    (2006.01)
(52) U.S. Cl. .............................. 326/86; 326/23; 326/27
(58) Field of Classification Search ................. 326/86, 326/23, 27; 375/219, 220; 370/276
See application file for complete search history.

(56) References Cited

U.S. PATENT DOCUMENTS

| | | | |
|---|---|---|---|
| 5,451,898 A | | 9/1995 | Johnson |
| 5,880,599 A | * | 3/1999 | Bruno .......................... 326/56 |
| 5,920,204 A | * | 7/1999 | Bruno .......................... 326/86 |
| 6,411,146 B1 | * | 6/2002 | Kuo ............................ 327/198 |
| 6,683,472 B1 | | 1/2004 | Best et al. |
| 6,812,736 B1 | | 11/2004 | Best et al. |
| 6,920,402 B1 | | 7/2005 | Liaw et al. |
| 6,920,540 B1 | | 7/2005 | Hampel et al. |

* cited by examiner

*Primary Examiner*—Daniel D. Chang
(74) *Attorney, Agent, or Firm*—Shemwell Mahamedi LLP

(57) ABSTRACT

Systems and methods for reducing electrical noise generated during bus turnaround in signal transfer systems are provided. These systems include differential drivers having current sources continuously coupled to a signal bus during all operating modes of the drivers. A first transistor of the driver couples a first signal line of the bus to the driver current source and a second transistor of the driver couples a second signal line of the bus to the driver current source. Each transistor receives control signals in accordance with the operating mode of the driver. These control signals continuously and selectively couple the current source to the bus lines in a manner which provides uniform current distribution across the bus during all driver operating modes. The uniform current distribution across the bus minimizes interruptions in driver current dissipation and any effects from self-induced supply noise during signal transfers.

39 Claims, 11 Drawing Sheets

REDUCING ELECTRICAL NOISE DURING BUS TURNAROUND IN SIGNAL TRANSFER SYSTEMS

TECHNICAL FIELD

The disclosure herein relates generally to signal transfer systems and methods. In particular, this disclosure relates to systems and methods for reducing supply noise during signal transfer operations.

BACKGROUND

Operating circuits in devices and semiconductor chips draw current from a supply network. These supply networks are typically inductive in nature and as such they provide a constant supply voltage during stabilized operations if the current dissipated by the circuits is constant. As such, there is minimal self-induced electrical noise (voltage fluctuation) generated by the supply network while supplying constant current. However, the inductive supply network rejects any immediate changes in current so that immediate changes in supplied current required as a result of changes in current dissipation of the circuits are rejected by the supply network. Instead, the supply network requires some period of time to adjust and stabilize the supply voltage at the newly required current level.

The changes in current required for supply to operating circuits causes a voltage disturbance among other local circuits of the device because, during the adjustment period, any difference between the required and supplied currents has to be accounted for by the local circuits. Specifically, capacitance of the local circuits is acting as storage for electrical energy, providing the changes in current until such time as the supply network stabilizes at the new current supply level. The changes in capacitance include increased/decreased capacitance charges, for example. These changes of electrical energy stored in the capacitance lead to voltage/current distortions in the local circuits that lead to generation of self-induced electrical noise, also referred to as supply noise.

A specific type of circuit commonly found in processing systems is a differential driver circuit or differential driver. The differential driver generally includes two single-ended drivers connected to a differential bus. One of the single-ended drivers couples data on a signal line of the bus while the other single-ended driver couples a complement of the data on another signal line of the bus. The current dissipated by a single-ended driver typically depends on the logic value of the data transmitted by the driver. Since differential drivers simultaneously transmit the data and its complement, the differential drivers always transmit low and high logic values during every data transmission regardless of the actual data value. The simultaneous transmission of low and high logic values means the differential drivers dissipate a constant current when active, a situation that results in minimal self-induced supply noise during the transmission periods.

Turning to a bidirectional bus system used for example in high-speed time-shared memory systems, the same bus lines are used to transmit data in two directions between circuits. Therefore, when data is transmitted from component A to component B, a differential driver at component A transmits data while a receiver at component B receives the data. Likewise, when data is transmitted from component B to component A, a differential driver at component B transmits data while a receiver at component A receives the data. The process of reversing direction of the data transfer is referred to as bus turnaround.

In performing bus turnaround, generally, the transmitter at component A and the receiver at component B are deactivated, and a differential driver at component B then transmits data to a receiver at component A. The process of activating/deactivating differential drivers during bus turnaround typically causes voltage/current changes in the local circuits, and these local voltage/current changes interrupt the current dissipation in the driver circuits thereby generating supply noise. This supply noise is a major source of simultaneous switching noise (SSN), jitter, and signal distortion introduced into transferred signals by the system.

The supply noise generated during bus turnaround might be reduced by allowing the drivers of a component to always remain active and disconnecting the driver from the bus during periods when the component is receiving data. Alternatively, the driver output can be directed onto another signal path during periods when the component is receiving data. However, disconnection or redirection of the driver output requires control circuits and accurate timing synchronization of the disconnection or redirection processes, where the timing involves coordinating between both the transmitting and the receiving components. Any perturbations in this timing would produce brief intervals where both drivers (transmitting component and receiving component) were connected to the bus or both drivers were disconnected from the bus, thereby resulting in local current changes and the associated supply noise.

The local current perturbations and hence the supply noise related to bus turnaround might also be reduced by keeping the drivers of all components active and superimposing signals of transmitting components and receiving components on the bus. The receivers would then require circuitry/logic for subtracting the data transmitted by a driver of the receiving component from the received data for periods during which that component is receiving data. While this solution avoids most timing issues it requires the use of additional circuitry/logic for processing the superimposed signals at the receivers. Further, this solution does not eliminate the need to exercise separate control over the driver currents in both the transmitting and receiving components.

The processing speed of electronic systems continues to increase and, as such, so does the need for high-speed transfer of information among components of these systems. As the accurate high-speed transfer of information depends partly upon the quality of the signaling channel, a need remains to reduce/eliminate noise in the signaling channel of high-speed processing systems.

Figure 1:
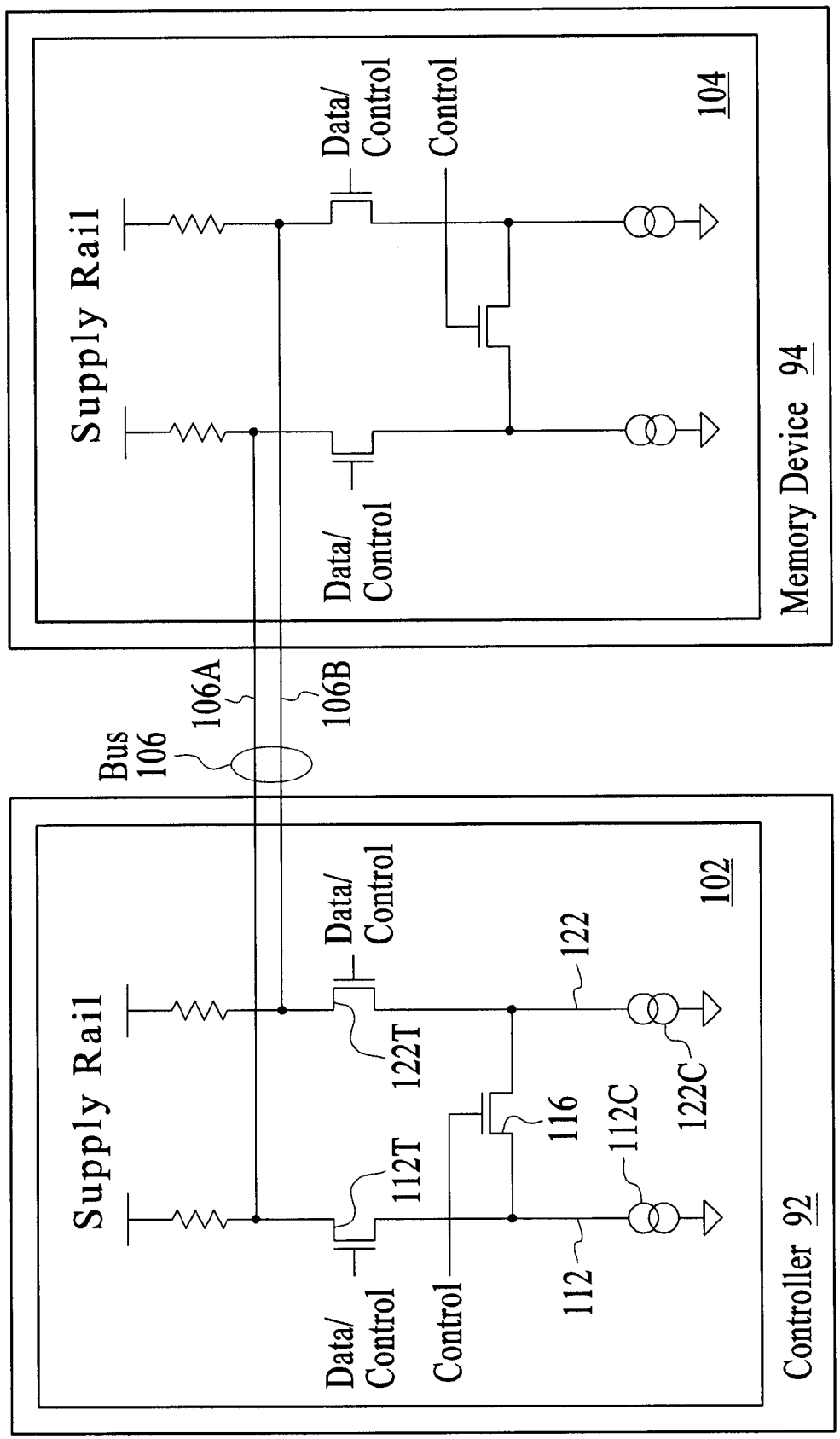
FIG. 1 is a block diagram of a signal transfer system including differential drivers which minimize supply noise due to changes in current across the signal transfer system, under an embodiment.

In the drawings, the same reference numbers identify identical or substantially similar elements or acts. To easily identify the discussion of any particular element or act, the most significant digit or digits in a reference number refer to the Figure number in which that element is first introduced (e.g., element 102 is first introduced and discussed with respect to FIG. 1).

DETAILED DESCRIPTION

Systems and methods for reducing electrical noise generated during bus turnaround in signal transfer systems are provided below. These systems include differential drivers having current sources continuously coupled to signal lines or a signal bus during transmit, turnaround, and receive operating modes of the drivers. The bus of an embodiment is a signal line or a set of signal lines used by an interface system to couple or connect a number of devices and to transfer information or data. The signal lines of an embodiment form a differential bus supporting time-shared signal transmissions. A first transistor of the driver couples a first signal line of the signal bus to the driver current source and a second transistor of the driver couples a second signal line of the signal bus to the driver current source. The first and second transistors receive control signals in accordance with the operating mode of the driver. These control signals continuously and selectively couple the current source to the bus signal lines in a manner that provides uniform current distribution across the bus during the transmit, turnaround, and receive operating modes. The uniform current distribution across the bus during all driver operations reduces or eliminates interruptions in driver current dissipation leading to a reduction or elimination in effects of self-induced supply noise during signal transfer operations.

In the following description, numerous specific details are introduced to provide a thorough understanding of, and enabling description for, embodiments of the signal transfer devices and methods. One skilled in the relevant art, however, will recognize that these embodiments can be practiced without one or more of the specific details, or with other components, systems, etc. In other instances, well-known structures or operations are not shown, or are not described in detail, to avoid obscuring aspects of the disclosed embodiments.

FIG. 1 is a block diagram of a signal transfer system 100 including differential drivers 102 and 104 that minimize supply noise due to changes in current across the signal transfer system 100, under an embodiment. The signal transfer system 100, also referred to as the signal system 100, includes a differential driver 102 and 104 in each of a first component or system 92 and a second component or system 94. The differential drivers 102 and 104 couple to transfer signals over a bus 106 or signal bus and include, for example, current mode drivers. The bus 106 is a bidirectional differential bus that is time-shared by the differential drivers 102/104, but is not so limited. The differential drivers 102/104 and the bus 106 operate under control of one or more processors or processing systems.

The signal system 100 of an embodiment is used, for example, to transfer data and other signals in a high-speed processing system. In this example signal system 100, the first component 92 is a memory controller 92 and the second component 94 is a memory device 94. The differential drivers 102/104 in combination with the bus 106 transfer data between the memory controller 92 and the memory device 94 during read and write operations to name a few. A receiver (not shown) is coupled to the memory device 94 and/or the controller 92 for use in receiving data transmitted by another driver.

The memory controller/memory device example is but one example of components which include/couple to differential drivers and is presented only as an example and is not to limit the differential drivers 102/104 described herein. Likewise, the signal system 100 is described herein through use of the two components 92/94, but many more components are typically coupled to one or more buses 106. For example, other components (not shown) coupled to the bus 106 can include any collection of computing components and devices operating together, as is known in the art. The components coupled to the bus 106 can also be components or subsystems within a larger computer system or network. The bus 106 can also couple among any number of components (not shown) known in the art, for example other buses, controllers, memory devices, and data input/output (I/O) devices, in any number of combinations.

Using a first differential driver 102 as reference, the differential driver 102 includes two single-ended drivers 112 and 122 coupled to the signal bus 106. A first single-ended driver 112 includes a transistor 112T having a source (drain) coupled to a first current source 112C and a drain (source) coupled to a first signal line 106A or signal trace of the bus 106 and a supply rail. A second single-ended driver 122 includes a transistor 122T having a source (drain) coupled to a second current source 122C and a drain (source) coupled to a second line 106B of the bus and a supply rail. The gates of both driver transistors 112T and 122T couple to receive data/control signals from components of the host processing system, as described below.

The differential driver 102 of an embodiment further includes a transistor 116 which couples the first 112C and second 122C current sources. This additional transistor 116 includes a source (drain) coupled to the first current source 112C and a drain (source) coupled to the second current source 122C. The gate of the additional transistor 116 couples to receive a control signal, as described below.

The differential driver 102 is configurable among a number of operating modes. The operating modes include, but are not limited to, a transmit mode, a bus turnaround mode (also referred to as a turnaround mode), and a receive mode. During write operations of the processing system, for example, the differential driver 102 of the controller 92 operates in a transmit mode while the differential driver 104 of the memory device 94 operates in a receive mode to receive data written to the memory device 94 by the controller 92. Likewise, during read operations of the processing system, the differential driver 104 of the memory device 94 operates in a transmit mode while the differential driver 102 of the controller 92 operates in a receive mode to support reading of the data from the memory device 94.

When operating as a transmitter (in a transmit mode), one single-ended driver of the differential driver couples data onto one signal line of the bus while the other single-ended driver couples a complement of the data onto another signal line of the bus. Because the differential driver simultaneously transmits the data and its complement, the differential driver always transmits low and high logic values during every data transmission regardless of the logic value of the data. This simultaneous transmission of low and high logic values means the differential driver dissipates a constant current when active, a situation that results in little/no self-induced electrical noise.

During transitions between transmit mode and receive mode, and between receive mode and transmit mode, the differential driver operates in the turnaround mode. In the turnaround mode, the differential driver of an embodiment is configured for approximately equal current distribution through each of the single-ended drivers resulting in an equivalent current on each signal line of the bus, as described below. Likewise, following transition from operating as a transmitter, through turnaround, to operating as a receiver (receive mode), the differential driver of an embodiment is configured for approximately equal current distribution through each of the single-ended drivers resulting in a constant common mode current offset on both signal lines of the bus, but no change in the (differential mode) current difference between the signal lines. Operation of differential drivers in each of transmit, turnaround, and receive operating modes is described below.

In describing operations in each of the transmit, turnaround, and receive operating modes, the signal transfer system of an embodiment including the differential driver configurations is generally described for illustrative purposes outside the context of any particular processing system which hosts the signal transfer system. Various modifications are possible as appropriate to the host system, and these modifications are within the scope of the systems and methods described below, as those skilled in the relevant art will recognize.

Figure 2:
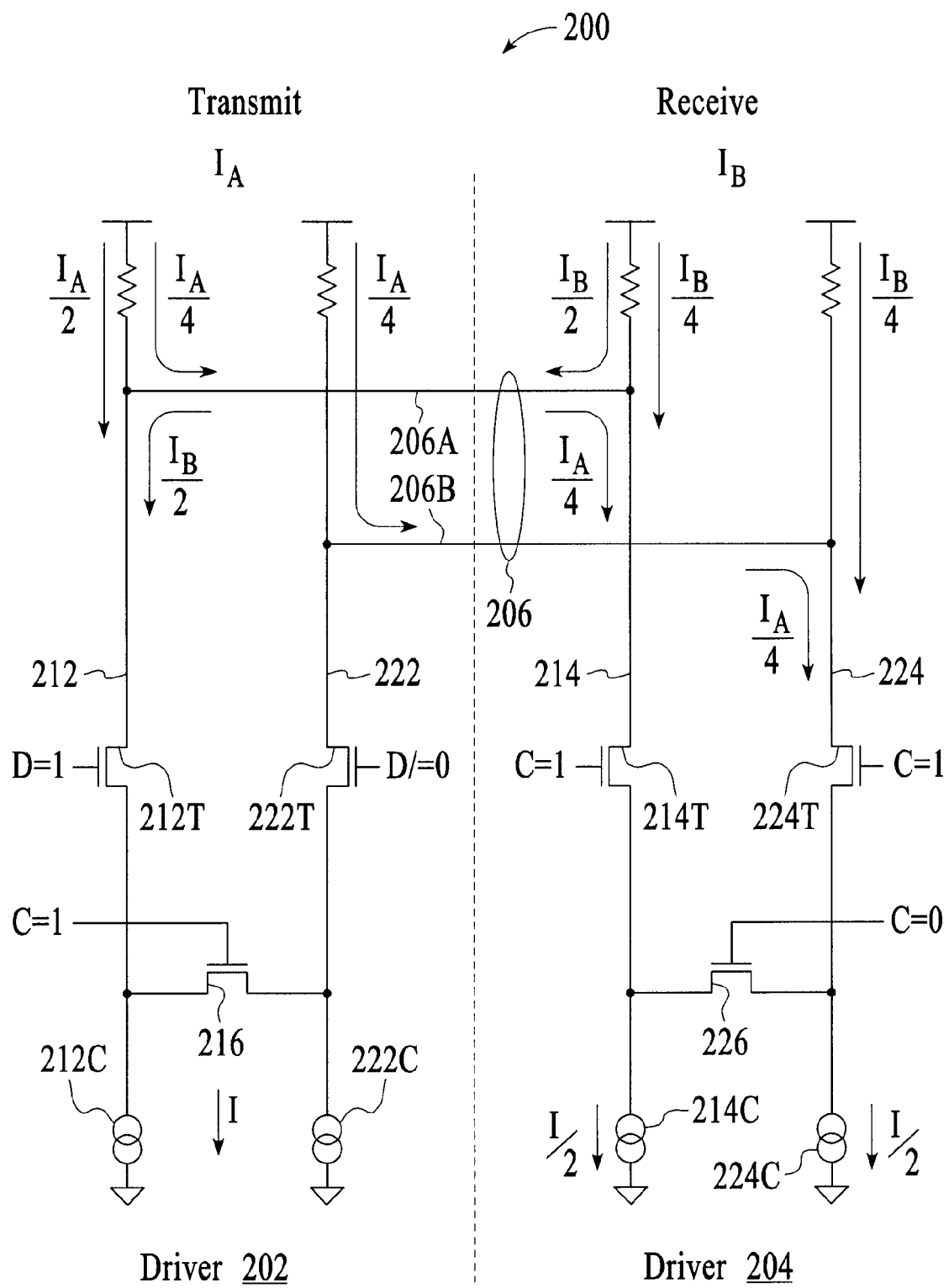
FIG. 2 is a block diagram of a signal transfer system including a first differential driver in transmit mode (transmit driver) coupled to a second differential driver in receive mode (receive driver), under an embodiment.

FIG. 2 is a block diagram of a signal transfer system 200 including a first differential driver 202 in transmit mode (transmit driver 202) coupled to a second differential driver 204 in receive mode (receive driver 204), under an embodiment. The transmit driver 202 includes two single-ended drivers 212 and 222. The first single-ended driver 212 includes a transistor 212T with a source (drain) coupled to a first current source 212C and a drain (source) coupled to a first bus line 206A. The second single-ended driver 222 includes a transistor 222T having a source (drain) coupled to a second current source 222C and a drain (source) coupled to a second bus line 206B. The gate of the first single-ended driver transistor 212T is controlled by data signals D while the gate of the second single-ended driver transistor 222T is controlled by complement data signals D/.

The transmit driver 202 also includes an additional transistor 216 which provides an electrical coupling between the first 212C and second 222C current sources. This additional transistor 216 includes a source (drain) coupled to the first current source 212C, a drain (source) coupled to the second current source 222C, and a gate coupled to receive a control signal C. The gate control signal C of this transistor 216 controls an electrical coupling of the first 212C and second 222C current sources. The additional transistor 216 is optional in alternative embodiments, as described below.

The receive driver 204 also includes two single-ended drivers 214 and 224. The first single-ended driver 214 includes a transistor 214T with a source (drain) coupled to a first current source 214C and a drain (source) coupled to the first bus line 206A. The second single-ended driver 224 includes a transistor 224T having a source (drain) coupled to a second current source 224C and a drain (source) coupled to the second bus line 206B. The gates of the first 214T and second 224T single-ended driver transistors are controlled by control signals C, where both control signals C have logic high values. The control signals C of alternative embodiments will, however, have logic values appropriate to the host system architecture.

An additional transistor 226 of the receive driver 204 couples the two current sources 214C/224C of the single-ended drivers. This additional transistor 226 includes a source (drain) coupled to the first current source 214C, a drain (source) coupled to the second current source 224C, and a gate coupled to receive a control signal C. The gate control signal C of the additional transistor 226 results in isolation of the first 214C and second 224C current sources. As in the transmit driver 202, the additional transistor 226 is optional in alternative embodiments, as described below.

One or more of the control signals C that control the single-ended drivers 212/222/214/224 and the current source couplings 216/226 of the differential drivers 202/204 are provided from any of a number of components in the processing system. In an embodiment, for example, the control signals C are generated by a controller like the memory controller described above with reference to FIG. 1. In an alternative embodiment the control signals C are generated using information stored in configuration or control registers in the processing system, as described below with reference to FIG. 8. Various other alternative embodiments can use any type/combination of controllers and/or registers as is appropriate to the host system.

In operation, the data D and data complement D/ signals applied to the single-ended drivers 212T/222T of the transmit driver 202, along with the coupling between the two current sources 212C/222C, provide a single electrical path between the first bus line 206A and a single current source formed from the two current sources 212C/222C. The current source provides a current I (I is the sum of currents provided by each of the first 212C (I/2) and second 222C (I/2) current sources). Additionally, the control signals C applied to both single-ended drivers 214/224 of the receive driver 204, along with the isolation of the two current sources 214C/224C, provides a first electrical path between the first bus line 206A and the first current source 214C and a second electrical path between the second bus line 206B and the second current source 224C. Each of the first 214C and second 224C current sources provides a current I/2, but the current sources are not so limited. The result of the transmit 202 and receive 204 driver configurations therefore is a continuous coupling of both the transmit driver current sources 212C/222C and receive driver current sources 214C/224C to the bus 206.

This transmit/receive driver configuration 202/204, while continuously coupling the current sources of both transmit and receive drivers to the bus, provides uniform current distribution across the bus 206, as shown by an analysis of the current flows across the system 200. Beginning with the transmit driver 202, total current I flows through the transmit driver 202, where I includes current $I_A/2$ supplied by the transmit driver supply rail $I_A$ and current $I_B/2$ supplied by the receive driver supply rail $I_B$ via the first bus line 206A (where $I_A$ represents currents from the transmit driver supply rail and $I_B$ represents currents from the receive driver supply rail, and $I=I_A=I_B$).

Continuing, total current I also flows through the receive driver 204. One-half of the current I/2 flows through the first single-ended driver 214 with current $I_A/4$ supplied by the transmit driver supply rail $I_A$ via the first bus line 206A and current $I_B/4$ supplied by the receive driver supply rail $I_B$. Likewise, the remaining one-half of the current I/2 flows through the second single-ended driver 224 with current $I_A/4$ supplied by the transmit driver supply rail $I_A$ via the second bus line 206B and current $I_B/4$ supplied by the receive driver supply rail $I_B$. Thus, equivalent current (I) through both transmit 202 and receive 204 drivers provides uniform current distribution across the bus 206 in the transmit/receive configuration.

Regarding detection of data on the bus 206, the transmit/receive driver configuration 202/204 results in a constant (differential mode) current offset between the bus lines 206A/206B. The analysis described above shows on the first bus line 206A a current of $I_B/2$ from driver 204 to driver 202 and a current of $I_A/4$ in the opposite direction from driver 202 to driver 204, adding up to a net current of I/4 from driver 204 to driver 202 ($I_B/2-I_A/4=I/4$). Further, the second bus line 206B carries current I/4 from driver 202 to driver 204 (where $I_A=I$). The offset of I/2 (I/4-(-I/4)) between the currents on the two bus lines 206A/206B results in detection of a logic high value on the first bus line 206A which corresponds to the logic high data input D to the transmit driver 202. Thus, data D can be detected by a receiver (not shown) using the constant differential mode current offset between the bus lines 206A/206B without the need for additional circuitry to subtract out the currents provided on the bus lines 206A/206B by the receiver.

The process of reversing direction of the data transfer is referred to as bus turnaround or turnaround. In performing bus turnaround, generally, the transmit driver is reconfigured to a receive mode and the receive driver is reconfigured to a transmit mode. Reconfiguration of the transmit driver includes reconfiguring the transmit driver from the transmit mode to the turnaround mode, and then from the turnaround mode to the receive mode. Similarly, reconfiguring the receive driver includes reconfiguring the receive driver from the receive mode to the turnaround mode, and then from the turnaround mode to the transmit mode. FIGS. 2, 3, 4, 5, and 6 collectively show the process of reversing the data transfer direction in a signal system, under an embodiment.

Figure 3:
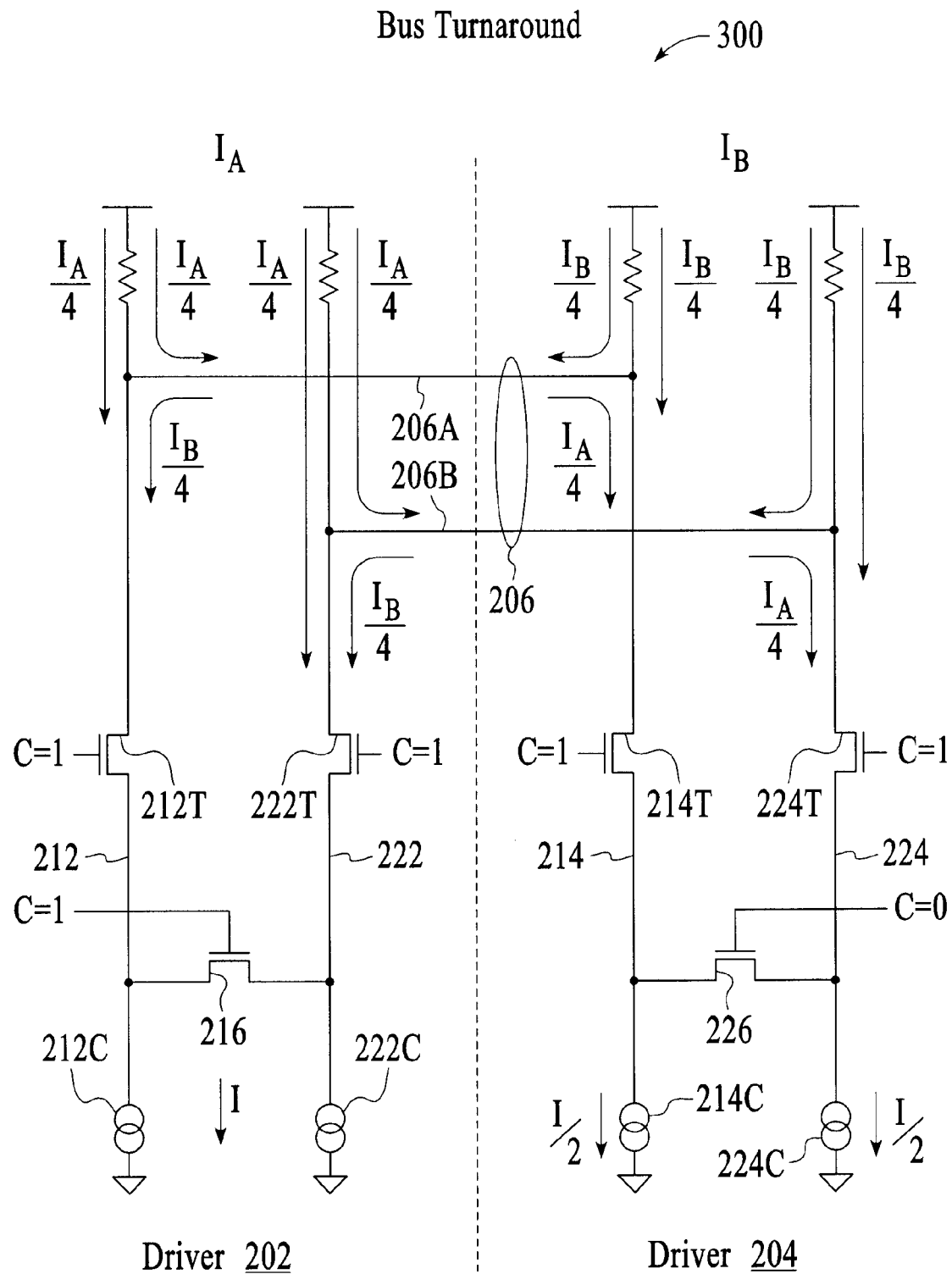
FIG. 3 is a block diagram of a signal transfer system during a first phase of driver reconfiguration/bus turnaround, under an embodiment.

The bus turnaround process begins by terminating the transfer of data signals and complement data signals to the differential driver currently acting as a transmit driver. The data signals and complement data signals coupled to the transmit driver are replaced by control signals applied to the gates of the single-ended driver transistors as appropriate. FIG. 3 is a block diagram of a signal transfer system 300 during a first phase of driver reconfiguration/bus turnaround, under an embodiment. The components of each of the first 202 and second 204 differential drivers, as well as the couplings among the components, are as described above with reference to FIG. 2 with an exception. Instead of being controlled by data signals D and complement data signals D/, the gates of the first 212T and second 222T single-ended driver transistors are controlled by control signals C, the control signals C having logic high values.

In operation, the control signals C applied to the single-ended drivers 212/222 of the first differential driver 202 generate an electrical path between each of the first 206A and second 206B bus lines and the current source 212C/222C. The current source 212C/222C provides a current I (the sum of currents provided by each of the first 212C and second 222C current sources). Additionally, the control signals C applied to both single-ended drivers 214/224 of the second differential driver 204, along with the isolation of the two current sources 214C/224C, provides a first electrical path between the first bus line 206A and the first current source 214C and a second electrical path between the second bus line 206B and the second current source 224C. The result therefore is a continuous coupling of the current sources of both the first 202 and second 204 differential drivers to the bus 206.

This segment of bus turnaround 300, while continuously coupling the current sources of both differential drivers 202/204 to the bus 206, provides uniform current distribution across the bus. Total current I flows through the first differential driver 202. One-half of this total current flows through the first single-ended driver 212 with current $I_A/4$ supplied by the first differential driver supply rail $I_A$ and current $I_B/4$ supplied by the second differential driver supply rail $I_B$ via the first bus line 206A. Likewise, the remaining one-half of the total current flows through the second single-ended driver 222 with current $I_A/4$ supplied by the first differential driver supply rail $I_A$ and current $I_B/4$ supplied by the second differential driver supply rail $I_B$ via the second bus line 206B.

Total current I also flows through the second differential driver 204 during this phase of turnaround. One-half of this total current flows through the first single-ended driver 214 with current $I_A/4$ supplied by the first differential driver supply rail $I_A$ via the first bus line 206A and current $I_B/4$ supplied by the second differential driver supply rail $I_B$. Likewise, the remaining one-half of the total current flows through the second single-ended driver 224 with current $I_A/4$ supplied by the first differential driver supply rail $I_A$ via the second bus line 206B and current $I_B/4$ supplied by the second differential driver supply rail $I_B$. Thus, equivalent current through each of the differential drivers 202/204 provides uniform current distribution across the bus 206.

The turnaround configuration 300 of an embodiment provides approximately no current on either of the bus lines 206A/206B. The analysis described above shows on the first bus line 206A a current of $I_A/4$ from driver 202 to driver 204 and a current of $I_B/4$ in the opposite direction from driver 204 to driver 202. Summing both currents on the bus line 206A results in no net current between drivers 202 and 204 ($I_A/4-I_B/4=0$). Further, the second bus line 206B also carries no current.

Figure 4:
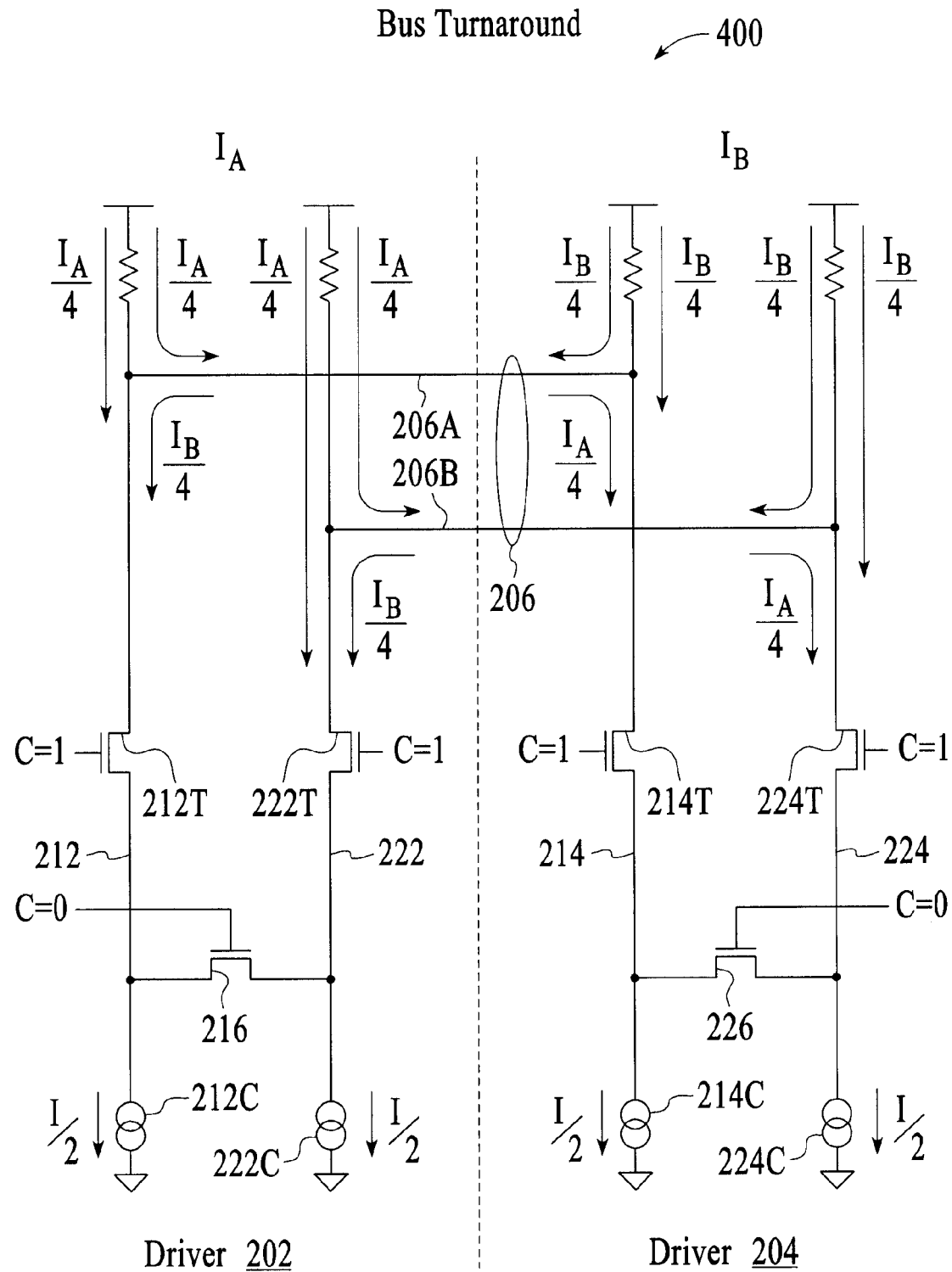
FIG. 4 is a block diagram of a signal transfer system during a second phase of driver reconfiguration/bus turnaround, under an embodiment.

Following application of control signals C to the single-ended drivers 212/222 of the first differential driver 202, the turnaround continues with the isolation of the first current source 212C from the second current source 222C in the first differential driver 202. FIG. 4 is a block diagram of a signal transfer system 400 during a second phase of driver reconfiguration/bus turnaround, under an embodiment. The components of each of the first 202 and second 204 differential drivers, as well as the couplings among the components, are as described above with reference to FIG. 3 with one exception. The control signal C at the gate of the additional transistor 216 coupled between the first 212C and second 222C current sources of the first differential driver 202 is changed to a logic low value which isolates the first 212C and second 222C current sources from one another.

In operation, the control signals C applied to both single-ended drivers 212/222 of the first differential driver 202, along with isolation of the two current sources 212C/222C, provides a first electrical path between the first bus line 206A and the first current source 212C. Further, this configuration results in a second electrical path between the second bus line 206B and the second current source 222C. Additionally, the control signals C applied to both single-ended drivers 214/224 of the second differential driver 204, along with the isolation of the two current sources 214C/224C, provides a first electrical path between the first bus line 206A and the first current source 214C and a second electrical path between the second bus line 206B and the second current source 224C. The result therefore is a continuous coupling of current sources of both the first 202 and second 204 differential drivers to the bus 206.

Total current I is again found to flow through each of the first 202 and second 204 differential drivers, and the equivalent current through each of the differential drivers 202/204 provides uniform current distribution across the bus 206, as described above with reference to FIG. 3. Thus, this portion of the turnaround 400 provides uniform current distribution across the bus 206 while continuously coupling the current sources of both differential drivers 202/204 to the bus 206. This portion of the turnaround 400 also continues to provide approximately no current on each of the bus lines 206A/ 206B.

Figure 5:
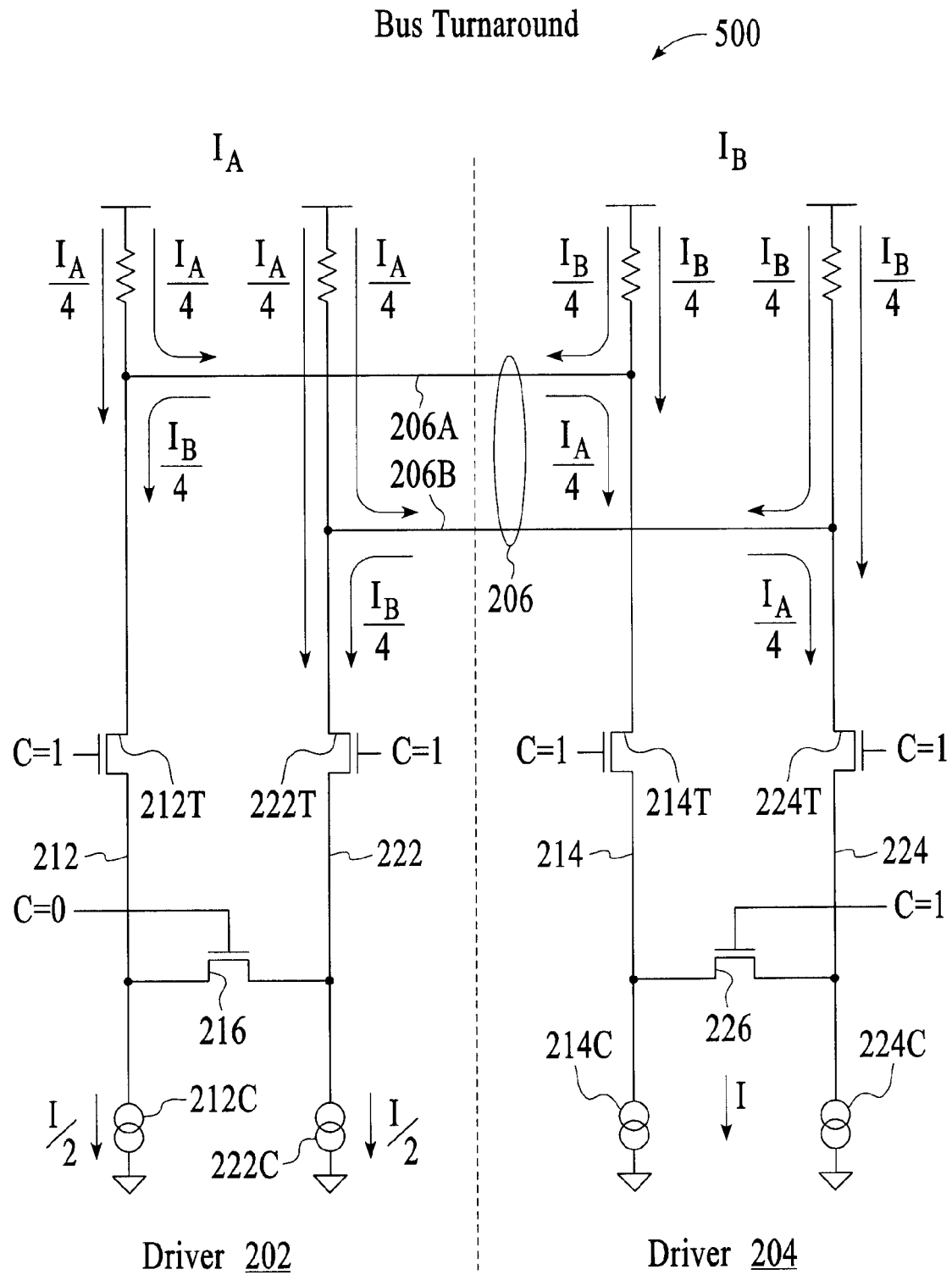
FIG. 5 is a block diagram of a signal transfer system during a third phase of driver reconfiguration/bus turnaround, under an embodiment.

Upon isolating the current sources of the first differential driver, the turnaround continues with the coupling of the current sources of the second differential driver. FIG. 5 is a block diagram of a signal transfer system 500 during a third phase of driver reconfiguration/bus turnaround, under an embodiment. The components of each of the first 202 and second 204 differential drivers, as well as the couplings among the system components, are as described above with reference to FIG. 4 with an exception. The control signal C at the gate of the additional transistor 226 coupled between the first 214C and second 224C current sources of the second differential driver 204 is changed to a logic high value to electrically couple the first 214C and second 224C current sources.

In operation, the control signals applied to both single-ended drivers 214/224 of the second differential driver 204 provides a first electrical path between the first bus line 206A and the current source 214C/224C and a second electrical path between the second bus line 206B and the current source 214C/224C. Additionally, the control signals applied to both single-ended drivers 212/222 of the first differential driver 202, along with isolation of the two current sources 212C/222C, provides a first electrical path between the first bus line 206A and the first current source 212C and a second electrical path between the second bus line 206B and the second current source 222C. The result therefore is a continuous coupling of current sources of both the first 202 and second 204 differential drivers to the bus 206.

Total current I continues to flow through each of the first 202 and second 204 differential drivers, and the equivalent current through each of the differential drivers 202/204 provides uniform current distribution across the bus 206, as described above with reference to FIGS. 3 and 4. Thus, this portion of the turnaround process 500 provides uniform current distribution across the bus 206 while continuously coupling the current sources of both differential drivers 202/204 to the bus 206. This portion of the turnaround 500 also continues to provide approximately no current on each of the bus lines 206A/206B.

Figure 6:
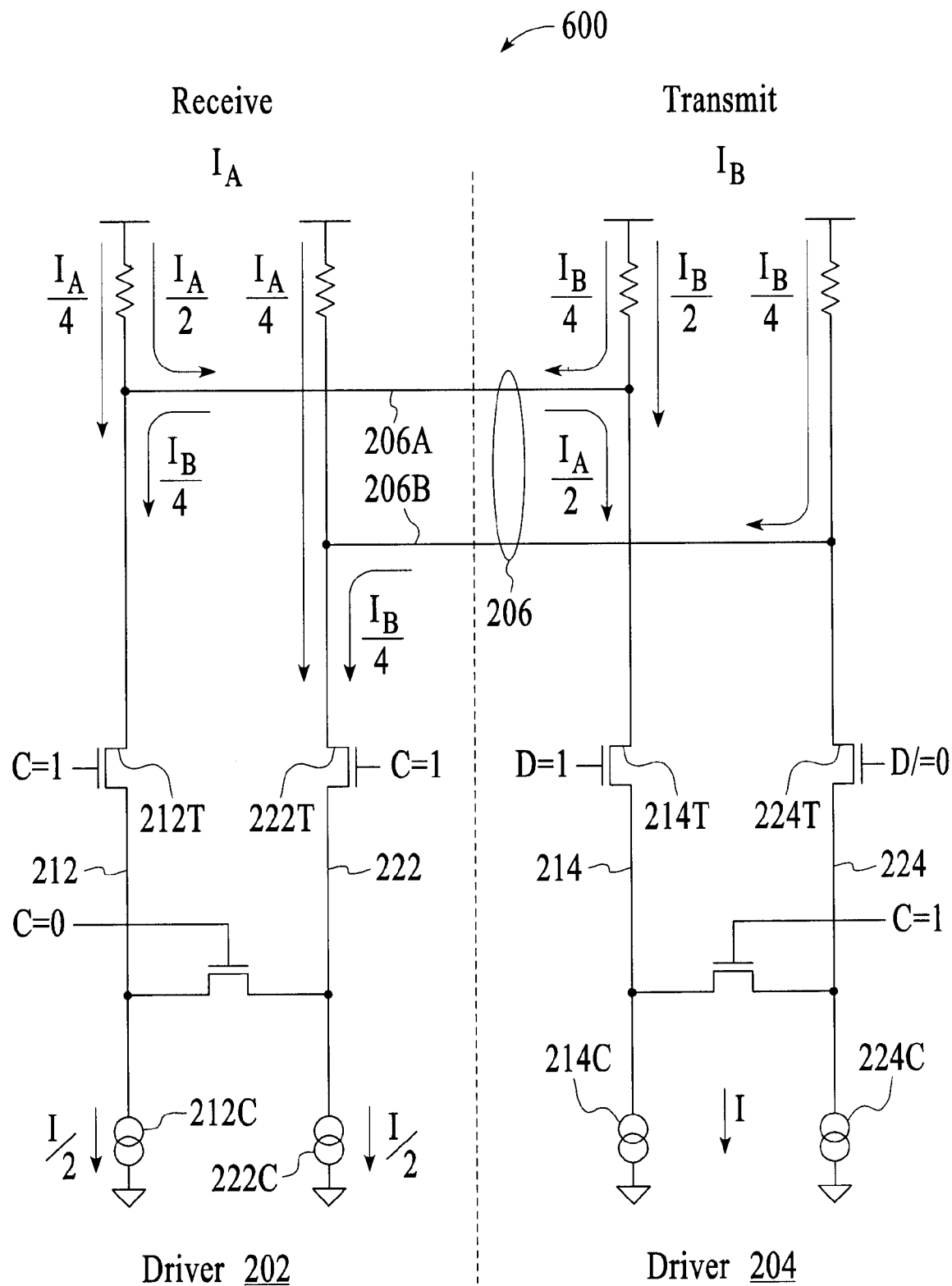
FIG. 6 is a block diagram of a signal transfer system including a first differential driver in receive mode (receive driver) coupled to a second differential driver in transmit mode (transmit driver), under an embodiment.

The coupling of the current sources of the second differential driver completes the bus turnaround of an embodiment so that the second differential driver is now configured as a transmit driver (transmit mode) and the first differential driver is configured as a receive driver (receive mode). FIG. 6 is a block diagram of a signal transfer system 600 including a first differential driver 202 in receive mode (receive driver 202) coupled to a second differential driver 204 in transmit mode (transmit driver 204), under an embodiment. The transmit driver 204 includes two single-ended drivers 214/224. The first single-ended driver 214 includes a transistor 214T with a source (drain) coupled to a first current source 214C and a drain (source) coupled to a first bus line 206A. The second single-ended driver 224 includes a transistor 224T having a source (drain) coupled to a second current source 224C and a drain (source) coupled to a second bus line 206B. The gate of the first single-ended driver transistor 214T is controlled by data signals D while the gate of the second single-ended driver transistor 224T is controlled by complement data signals D/.

The transmit driver 204 further includes an additional transistor 226 coupled between the first 214C and second 224C current sources. This additional transistor 226 includes a source (drain) coupled to the first current source 214C, a drain (source) coupled to the second current source 224C, and a gate coupled to receive a control signal C. The control signal C at the gate of the additional transistor 226 controls an electrical coupling of the first 214C and second 224C current sources.

The receive driver 202 also includes two single-ended drivers 212/222. The first single-ended driver 212 includes a transistor 212T with a source (drain) coupled to a first current source 212C and a drain (source) coupled to the first bus line 206A. The second single-ended driver 222 includes a transistor 222T having a source (drain) coupled to a second current source 222C and a drain (source) coupled to the second bus line 206B. The gates of the first and second single-ended driver transistors 212T/222T are controlled by control signals C, where both control signals C have a logic high value. An additional transistor 216 couples between the two current sources 212C/222C of the single-ended drivers 212/222. This additional transistor 216 includes a source (drain) coupled to the first current source 212C, a drain (source) coupled to the second current source 222C, and a gate coupled to receive a control signal C. The control signal C at the gate of this additional transistor 216 isolates the first 212C and second 222C current sources from one another in the receive configuration.

In operation, the data D and data D/ complement signals applied to the single-ended drivers 214/224 of the transmit driver 204, along with the coupling of the two current sources 214C/224C, provides a single electrical path between the first bus line 206A and a single current source 214C/224C which provides a current I (I is the sum of currents provided by each of the first 214C and second 224C current sources). Further, the control signals applied to both single-ended drivers 212/222 of the receive driver 202, along with the isolation of the two current sources 212C/ 222C of the receive driver 202, provides a first electrical path between the first bus line 206A and the first current source 212C and a second electrical path between the second bus line 206B and the second current source 222C. The result therefore is a continuous coupling of current sources of both the transmit 204 and receive 202 drivers to the bus 206.

This transmit/receive driver configuration 600, while continuously coupling the current sources of both transmit 204 and receive 202 drivers to the bus 206, provides uniform current distribution across the bus 206. Total current I flows through the transmit driver 204, with current $I_A/2$ supplied by the receive driver supply rail $I_A$ via the first bus line 206A and current $I_B/2$ supplied by the transmit driver supply rail $I_B$ (where $I_A$ now represents currents from the receive driver supply rail and $I_B$ represents currents from the transmit driver supply rail, and $I=I_A=I_B$).

Total current I also flows through the receive driver 202. One-half of this total current I/2 flows through the first single-ended driver 212 with current $I_A/4$ supplied by the receive driver supply rail $I_A$ and current $I_B/4$ supplied by the transmit driver supply rail $I_B$ via the first bus line 206A. Likewise, the remaining one-half of the total current I/2 flows through the second single-ended driver 222 with current $I_A/4$ supplied by the receive driver supply rail $I_A$ and current $I_B/4$ supplied by the transmit driver supply rail $I_B$ via the second bus line 206B. The approximately equivalent currents through each of transmit 204 and receive 202 driver results in uniform current distribution across the bus 206.

Regarding detection of data on the bus 206, the transmit/receive driver configuration 600 results in a constant differential mode current offset between the bus lines 206A/206B. The analysis described above shows on the first bus line 206A a current of $I_A/2$ from driver 202 to driver 204 and a current of $I_B/4$ in the opposite direction from driver 204 to driver 202, adding up to a net current of I/4 from driver 202 to driver 204 ($I_A/2-I_B/4=I/4$). Further, the second bus line 206B carries current I/4 (where $I_B=I$) from driver 202 to driver 204. The offset of I/2 (I/4−(−I/4)) between the currents on the two bus lines 206A/206B results in detection of a logic high value on the first bus line 206A which corresponds to the logic high data (D=1) input to the transmit driver 204. Thus, data can be detected by a receiver (not shown) using the constant differential mode current offset between the bus lines 206A/206B without the need for additional receiver circuitry to subtract currents on the bus lines 206A/206B.

Uniform current distribution across the bus can be verified using continuous measurements of current across the bus during system operations. Use of the signal transfer systems and methods described herein result in measurements that demonstrate the uniform current distributions as described above. However, measurements across the bus of systems using signal transfer devices and methods other than those described herein would show one or more periods of time during which currents across the bus were non-uniform. The non-uniformity in current across the bus found in typical signal transfer systems occurs as a result of imprecise synchronization during reconfiguration of the current transmit driver (to a receive driver) and the current receive driver (to a transmit driver). Consequently, if both transmit and receive drivers are in an inactive state during a period of time then no current is measured on the bus for that period. Further, if both transmit and receive drivers are in an active state during a period of time then a current greater than the steady state current is measured on the bus.

The turnaround described above with reference to FIGS. 2, 3, 4, 5, and 6 describes a sequence of substituting data/data complement signals applied to a differential driver currently functioning as a transmit driver with control signals, isolating the current sources of the transmit driver from one another, and providing a coupling between the current sources of a differential driver currently functioning as a receive driver. The reconfiguration of differential drivers during turnaround under alternative embodiments, however, can perform these reconfigurations simultaneously or near simultaneously, can include additional interim configurations, and can perform these reconfigurations using one or more different sequences.

Figure 7:
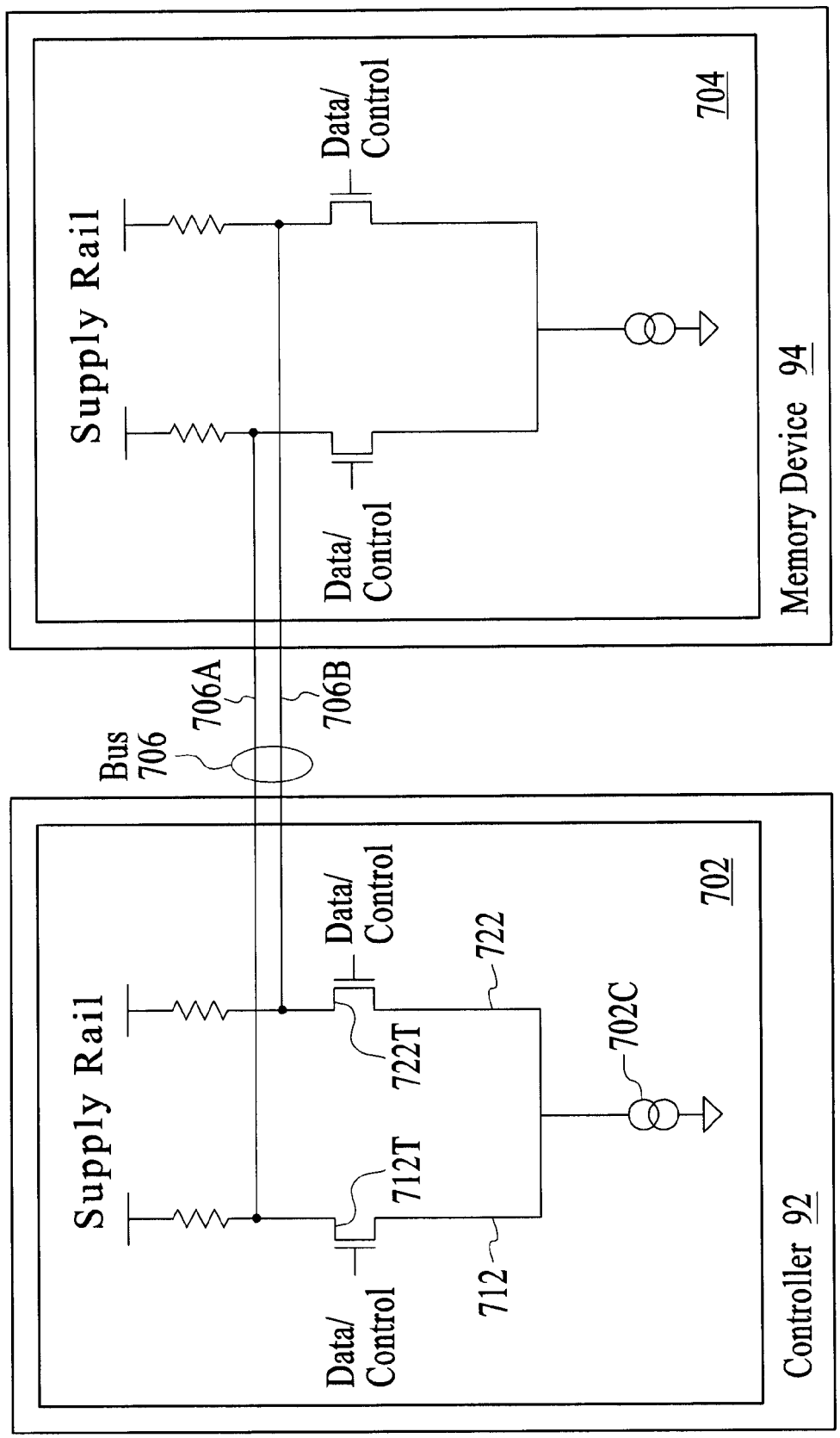
FIG. 7 is a block diagram of a signal transfer system including differential drivers each with a single current source, under an alternative embodiment.

As described above, the use of dual current sources with an additional transistor to control coupling of the current sources is optional. Consequently, differential drivers of alternative embodiments include two single-ended drivers coupled between the signal bus and a single current source. FIG. 7 is a block diagram of a signal transfer system 700 including differential drivers 702/704 each with a single current source, under an alternative embodiment. The signal transfer system 700 includes a differential driver 702 and 704 in each of a first component or system 92 (controller 92 for example) and a second component or system 94 (memory device 94 for example). The differential drivers 702 and 704 couple to a bus 706 or signal bus and include, for example, current mode drivers. The bus 706 is a bidirectional differential bus, but is not so limited. The differential drivers 702 and 704 and the bus 706 operate under control of one or more processors.

Using a first differential driver 702 as an example, the differential driver 702 includes a first single-ended driver 712 and a second single-ended driver 722. The first single-ended driver 712 includes a transistor 712T having a source (drain) coupled to the current source 702C and a drain (source) coupled to a first line 706A of the bus 706. The second single-ended driver 722 includes a transistor 722T having a source (drain) coupled to the current source 702C and a drain (source) coupled to a second line 706B of the bus 706. The gates of the driver transistors 712T/722T couple to receive data/control signals as described above. Except for use of a single current source 702C instead of two current sources and the coupling transistor (described above), the structure and operation of the differential drivers 712/722 is as described above with reference to FIGS. 1, 2, 3, 4, 5, and 6.

The driver 202 can also be configured to disconnect the current sources from the signal bus when used in receive mode. In this configuration the driver 202 is used in the same way as a common differential driver and will create supply noise during bus turnaround. However, it can be useful to configure the driver 202 if the second device connected to the transmission system uses a traditional differential driver circuit that does not support the continuous current mode offered by driver 202. It can also be useful in systems where bus turnaround is a rare event, and the system can wait after each bus turnaround until supply noise has faded.

Figure 8:
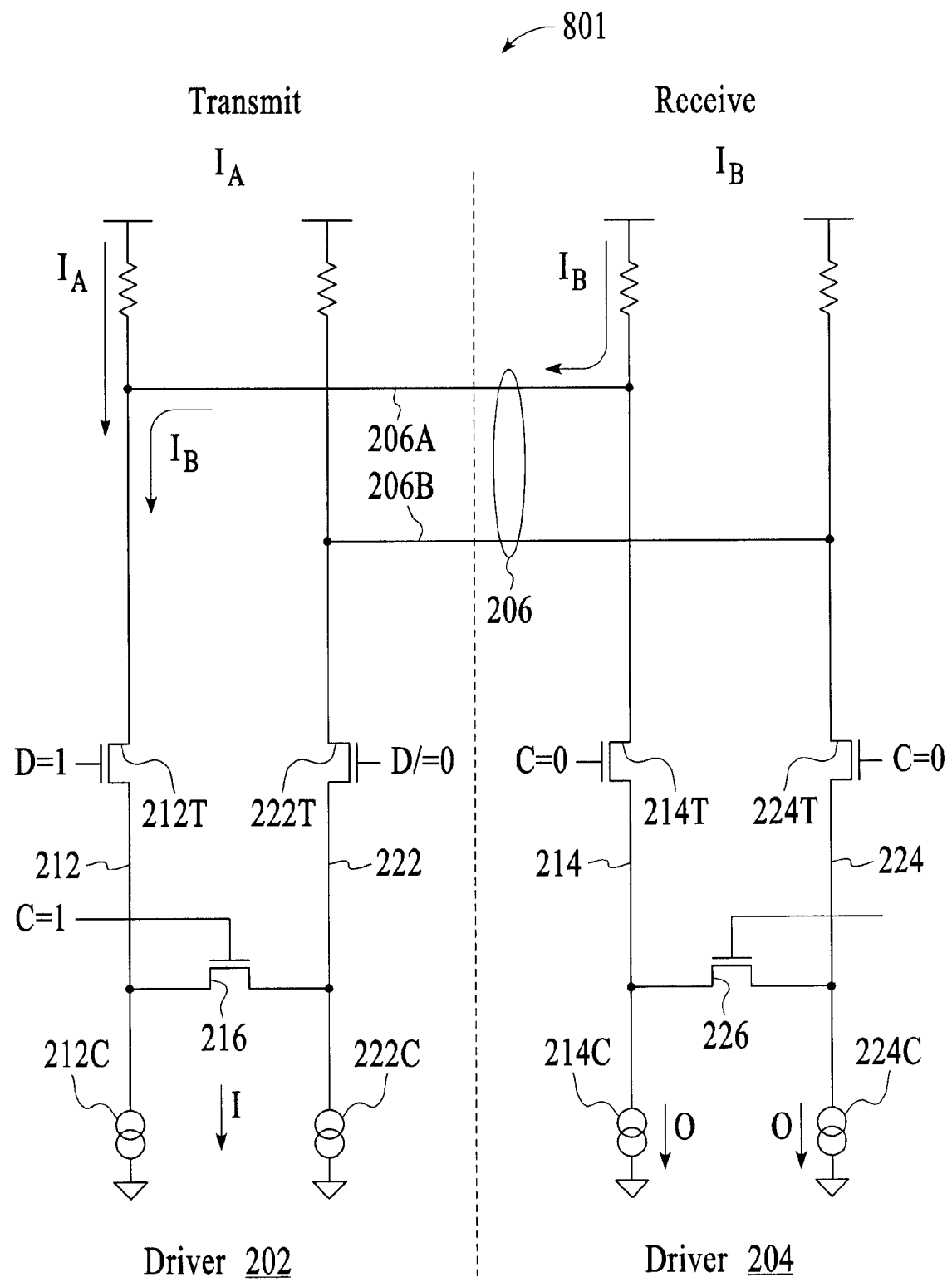
FIG. 8 is a block diagram of a signal transfer system using the first driver as transmitter and the second driver as receiver, under an embodiment.

FIG. 8 is a block diagram of a signal transfer system 801 using the first driver 202 as transmitter and the second driver 204 as receiver, under an embodiment. The receiver 204 is used in a mode not using the continuous current feature. The components of each of the first 202 and second 204 differential drivers, as well as the couplings among the components, are as described above with reference to FIG. 2 with an exception. The control signals controlling the gates of the first 214T and the second 224T single-ended driver transistors of driver 204 have a logic low value instead of a logic high value. This is one way to disconnect the current sources 214C and 224C from the signal bus 206, but not the only way.

In operation, the data D and the data complement D/ signals applied to the single-ended drivers 212T/222T of the transmitter driver 202, along with the coupling between the two current sources 212C/222C, provide a single electrical path between the first bus line 206A and a single current source formed from the two current sources 212C/222C. The current source provides a current I (I is the sum of currents provided by each of the first 212C (I/2) and second 222C (I/2) current sources).

This transmit/receive driver configuration 202/204, while continuously coupling the current sources of the transmit drivers to the bus, provides uniform current distribution across the bus 206, as shown by an analysis of the current flows across the system 200. Total current I flows through the transmit driver 202, where I includes current $I_A$ supplied by the transmit driver supply rail $I_A$ and current $I_B$ supplied by the receive driver supply rail $I_B$ via the first bus line 206A (where $I_A$ represents currents from the transmit driver supply rail and $I_B$ represents currents from the receive driver supply rail, and $I/2=I_A=I_B$).

Regarding detection of data on the bus 206, the analysis for transmitter/receiver driver configuration 202/204 results in a current of I/2 on the first bus line 206A and no current on the second bus line 206B. The offset of I/2 between the currents on the two bus lines 206A/206B results in detection of a logic high value on the first bus line 206A which corresponds to the logic high data input D to the transmitter driver 202. Thus, data can be detected by a receiver (not shown) using the constant differential mode current offset between the bus lines 206A/206B. This differential mode current offset is the same as using driver 202 in a continuous current operation mode, and so both modes can use the same receiver circuit.

Figure 9:
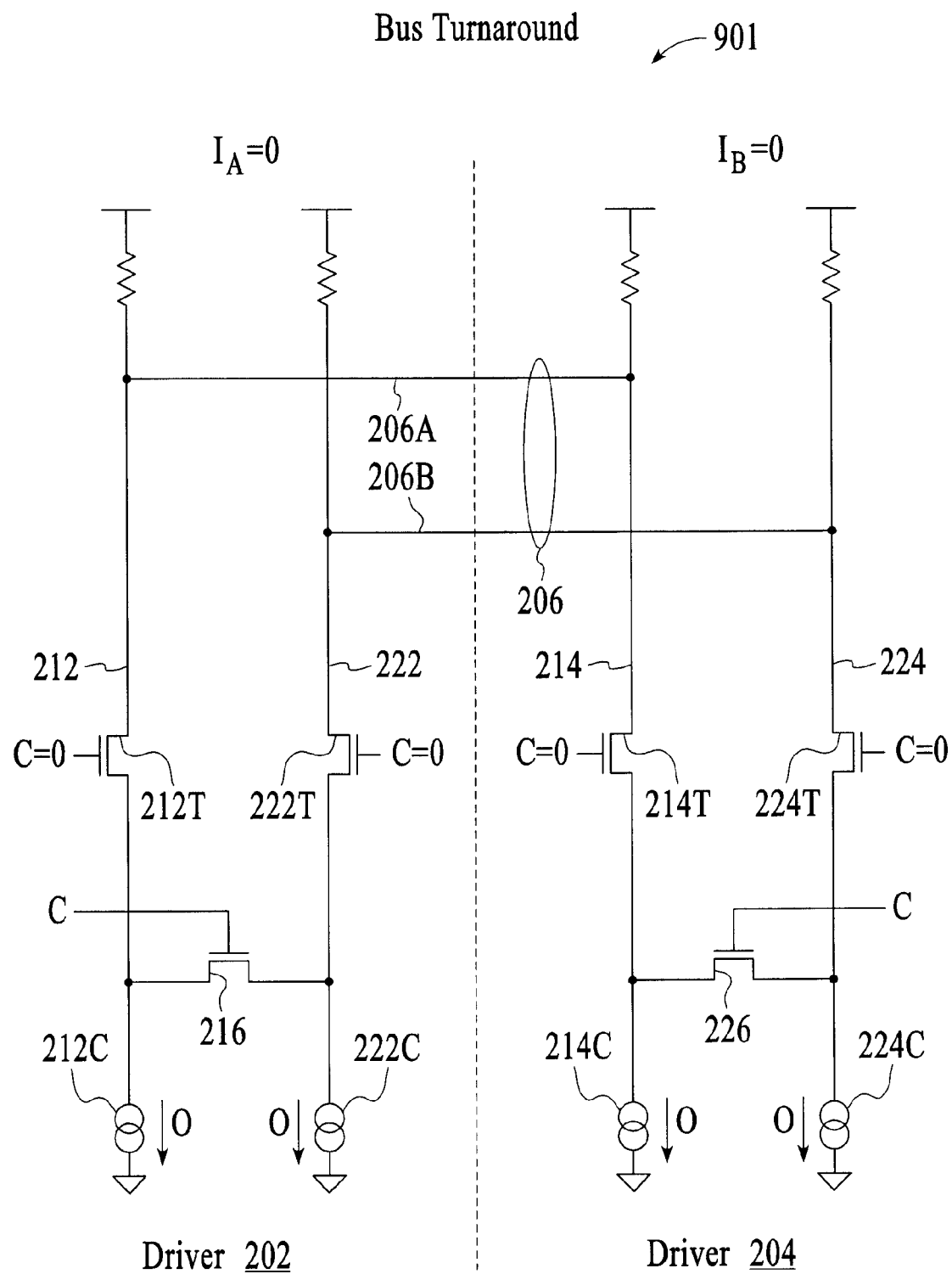
FIG. 9 is a block diagram of a signal transfer system during driver reconfiguration/bus turnaround, under an embodiment.

The bus turnaround process begins by terminating the transfer of data signals and complement data signals to the differential driver currently acting as a transmitter driver. The data signals and complement data signals coupled to the transmit driver are replaced by control signals applied to the gates of the single-ended driver transistors as appropriate. FIG. 9 is a block diagram of a signal transfer system 901 during driver reconfiguration/bus turnaround, under an embodiment. The components of each of the first 202 and second 204 differential drivers, as well as the couplings among the components, are described above with reference to FIG. 8 with an exception. Instead of being controlled by data signals D and complement data signals D/, the gates of the first 212T and second 222T single-ended driver transistors are controlled by control signals C, the control signals C having logic low values. This is one way to disconnect the current sources 212C and 222C from the signal bus 206, but not the only way.

In operation, there are no electrical paths between the bus lines 206 and the current sources of either driver 202 or driver 204. No currents are flowing in the drivers or in the bus lines 206.

Figure 10:
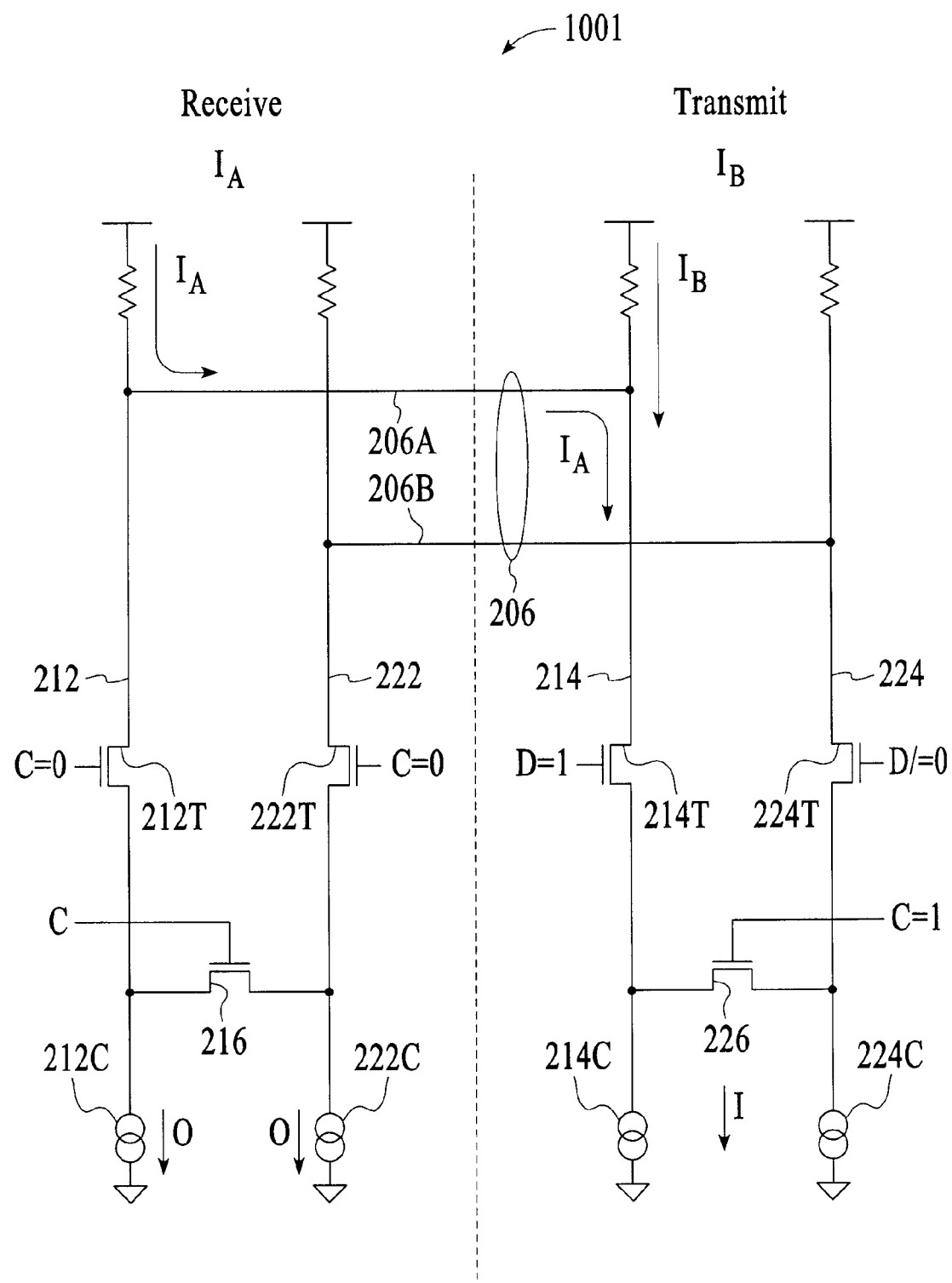
FIG. 10 is a block diagram of a signal transfer system including a first differential driver in receive mode (receive driver) coupled to a second differential driver in transmit mode (transmit driver), under an embodiment.

Coupling the current sources of the second driver completes the bus turnaround of an embodiment so that the second differential driver is not configured as a transmit driver (transmit mode) and the first differential driver is configured as a receive driver (receive mode). FIG. 10 is a block diagram of a signal transfer system 1001 including a first differential driver 202 in receive mode (receive driver 202) coupled to a second 15 differential driver 204 in transmit mode (transmit driver 204), under an embodiment. The components of each of the first 202 and second 204 differential drivers, as well as the couplings among the components, are as described above with reference to FIG. 9 with an exception. Instead of being connected to a control signal with logical low value, the gates of the first 214T and second 224T transistors are controlled by the data signals D 20 and complement data signal D/.

In operation, the data D and the data complement D/ signals applied to the single-ended drivers 214T/224T of the transmitter driver 204, along with the coupling between the two current sources 214C/224C, provide a single electrical path between the first bus line 206A and a single current source formed from the two current sources 214C/224C. The current source provides a current I (I is the sum of currents provided by each of the first 214C (I/2) and second 224C (I/2) current sources).

This transmit/receive driver configuration 202/204, while continuously coupling the current sources of the transmit drivers to the bus, provides uniform current distribution across the bus 206, as shown by an analysis of the current flows across the 30 system 200. Total current I flows through the transmit driver 204, where I includes current $I_A$ supplied by the transmit driver supply rail $I_A$ and current $I_B$ supplied by the receive driver supply rail $I_B$ via the first bus line 206A (where $I_A$ represents currents from the transmit driver supply rail and $I_B$ represents currents from the receive driver supply rail, and $I/2=I_A=I_B$).

Regarding detection of data on the bus 206, the analysis for transmitter/receiver driver configuration 202/204 results in a current of I/2 on the first bus line 206A and no current on the second bus line 206B. The offset of I/2 between the currents on the two bus lines 206A/206B results in detection of a logic high value on the first bus line 206A which corresponds to the logic high data input D to the transmitter driver 204. Thus, data can be detected by a receiver (not shown) using the constant differential mode current offset between the bus lines 206A/206B. This differential mode current offset is the same as using driver 204 in a continuous current operation mode, and so both modes can use the same receiver circuit.

Configuring the differential drivers 202/204 in continuous current mode, as shown in systems 200, 300, 400, 500, and 600, or configuring the differential drivers 202/204 into non-continuous current mode, as shown in systems 801, 901, and 1001, can be done one time during initializing of the transmission system, or it can be done numerous times during operation of the transmission system.

As described above, one or more of the control signals used in control of the single-ended drivers and the current source couplings of the differential drivers described above are generated by any of a number of components in the processing system. While controllers generate the control signals in some embodiments, other embodiments use configuration or control registers to store information for use in generating the control signals.

Figure 11:
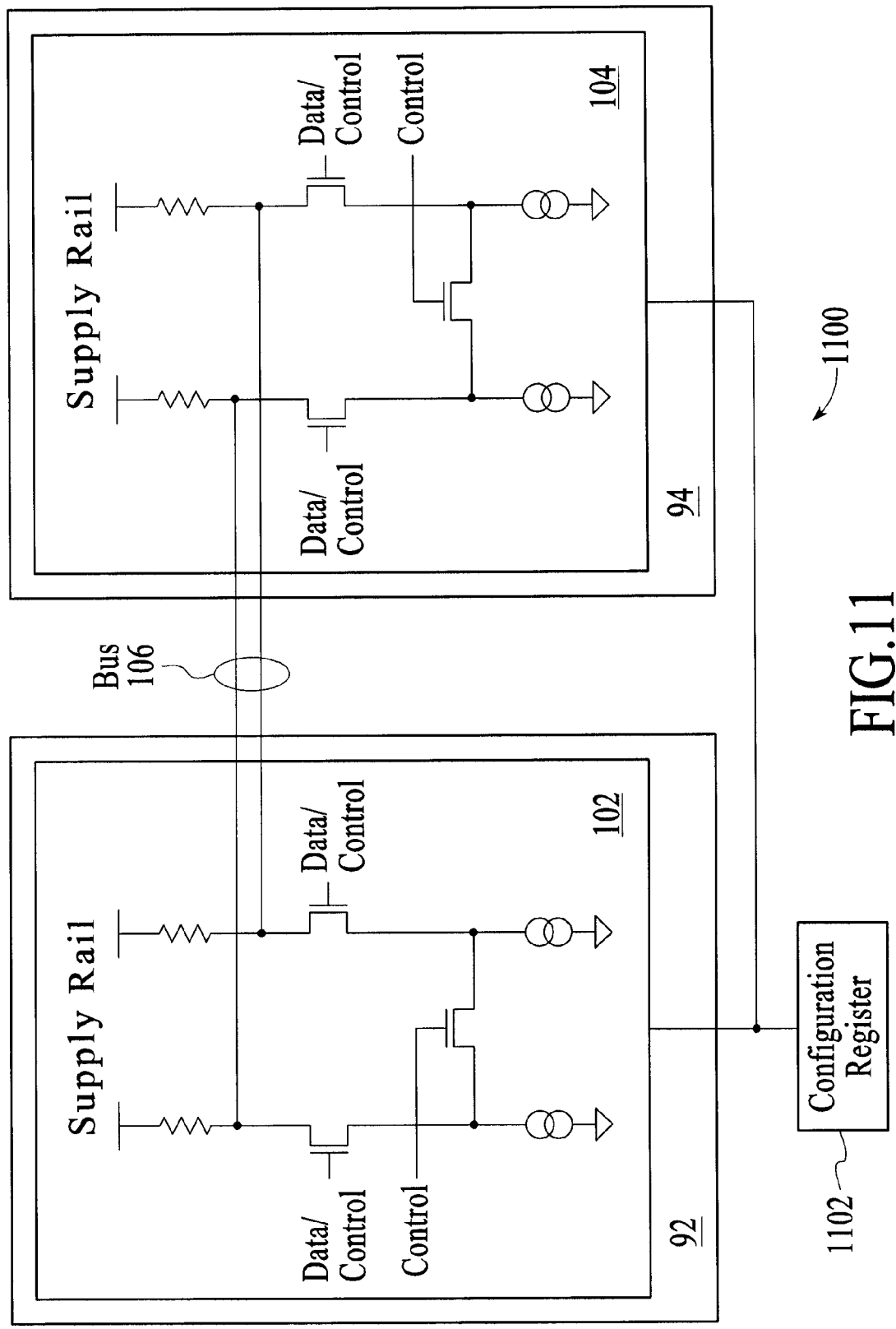
FIG. 11 is a block diagram of a signal transfer system including a configuration register for control of differential drivers in minimizing supply noise due to changes in current across the signal transfer system; under an alternative embodiment.

As an example, FIG. 11 is a block diagram of a signal transfer system 1100 including a configuration register 1102 for control of differential drivers 102 and 104 in minimizing supply noise due to changes in current across the signal transfer system, under an alternative embodiment. The signal transfer system 1100 includes a differential driver 102/104 in each of first 92 and second 94 components or systems. The differential drivers 102/104 couple to a bus 106 and include, for example, current mode drivers. The components of each of the first 102 and second 104 differential drivers, as well as the couplings among the components, are as described above with reference to FIGS. 1, 2, 3, 4, 5, 6, and 7. The bus 106 is a bidirectional differential bus, but is not so limited. The differential drivers 102/104 and the bus 106 operate under control of one or more processors (not shown).

The configuration register 1102 is represented as a single component coupled to each of the differential drivers 102/104, but alternative embodiments can use any number of registers controlling any number/combination of differential drivers. The control signals generated using information of configuration registers 1102 are used to control the single-ended drivers and the current source couplings of the differential drivers 102/104 as described above with reference to FIGS. 1–10. Use of configuration registers 1102 supports selective activation/deactivation of transmit, turn-around, and receive operating modes in the differential drivers.

Aspects of the signal transfer devices and methods described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the signal transfer devices and methods include: microcontrollers with memory (such as electronically erasable programmable read only memory (EEPROM)), embedded microprocessors, firmware, software, etc. Furthermore, aspects of the signal transfer devices and methods may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the signal transfer devices and methods is not intended to be exhaustive or to limit the systems and methods to the precise form disclosed. While specific embodiments of, and examples for, the signal transfer devices and methods are described herein for illustrative purposes, various equivalent modifications are possible within the scope of the systems and methods, as those skilled in the relevant art will recognize. The teachings of the signal transfer devices and methods provided herein can be applied to other processing systems, not only for the systems described above.

The elements and acts of the various embodiments described above can be combined to provide further embodiments. These and other changes can be made to the signal transfer devices and methods in light of the above detailed description.

In general, in the following claims, the terms used should not be construed to limit the signal transfer devices and methods to the specific embodiments disclosed in the specification and the claims, but should be construed to include all processing systems that operate under the claims to provide signal transfer. Accordingly, the signal transfer devices and methods are not limited by the disclosure, but instead the scope of the systems and methods is to be determined entirely by the claims.

While certain aspects of the signal transfer devices and methods are presented below in certain claim forms, the inventors contemplate the various aspects of the systems and methods in any number of claim forms. For example, while only one aspect of the system is recited as embodied in computer-readable medium, other aspects may likewise be embodied in computer-readable medium. Accordingly, the inventors reserve the right to add additional claims after filing the application to pursue such additional claim forms for other aspects of the signal transfer devices and methods.

What is claimed is:

1. A driver device comprising a first electrical path having a first transistor coupled to a first line of a signal bus and at least one current source and a second electrical path having a second transistor coupled to a second line of the signal bus and the current source, wherein the first and second transistors receive control signals to selectively couple the current source to the signal bus in a manner that provides uniform current distribution across the signal bus during each of a plurality of driver operating modes including a bus turn-around modes, wherein the signal bus is a differential bus supporting bi-directional time-shared signal transmissions.

2. The device of claim 1, wherein the current source comprises a first current source coupled to the first transistor and a second current source coupled to the second transistor.

3. The device of claim 2, further comprising a third transistor coupled to the first and second current sources, the third transistor selectively coupling the first and second current sources in response to the driver operating modes.

4. The device of claim 3, wherein the driver operating modes include transmit, turnaround, and receive modes, wherein the control signals cause the third transistor to be in an on state in the transmit mode and in an off state in the turnaround mode and the receive mode.

5. The device of claim 1, wherein the driver operating modes include transmit modes during which the control signals couple data signals to the first transistor and data complement signals to the second transistor.

6. The device of claim 1, wherein during the bus turn-around mode the control signals cause each of the first and second transistors to be in an on state that results in an approximately equal current distribution through each of the first and second electrical paths and an approximately equal current on the first and second signal lines of the bus.

7. The device of claim 1, wherein the driver operating modes include receive modes during which the control signals cause each of the first and second transistors to be in an on state that results in an approximately equal current distribution through each of the first and second electrical paths and uniform current distribution across the bus.

8. A signal transfer system, comprising:
a bidirectional differential bus;
a first driver coupled to the bus and to a first set of control signals, the first driver including a first current source; and a second driver coupled to the bus and to a second set of control signals, the second driver including a second current source and time-sharing the bus with the first driver, wherein the first and second current sources are selectively coupled to the bus, wherein the first set and second set of control signals control the first and second drivers to provide a uniform supply current distribution across the bus during each of a plurality of driver operating modes, including a bus turnaround mode.

9. The system of claim 8, wherein the first driver is in a transmit operating mode and the second driver is in a receive operating mode, wherein the second set of control signals control an approximately equal current distribution through each of two signal paths of the second driver and a constant common mode current offset between signal lines of the bus.

10. The system of claim 8, wherein the first and second drivers are each in a turnaround mode, wherein the first set of control signals control an approximately equal current distribution through each of two signal paths of the first driver and the second set of control signals control an approximately equal current distribution through each of two signal paths of the second driver, wherein an equivalent current is on each signal line of the bus.

11. The system of claim 8, wherein the first current source includes first and second current elements, wherein the first driver further comprises first and second electrical paths, the first electrical path coupled to a first signal line of the bus and the first current element and including a first control device coupled for control by the first set of control signals, the second electrical path coupled to a second signal line of the bus and the second current element and including a second control device coupled for control by the first set of control signals.

12. The system of claim 11, further comprising a third control device coupled to the first and second current elements, the third control device selectively coupling the first and second current elements in response to the driver operating mode.

13. The system of claim 8, wherein the second current source includes third and fourth current elements, wherein the second driver further comprises third and fourth electrical paths, the third electrical path coupled to a first signal line of the bus and the third current element and including a fourth control device coupled for control by the second set of control signals, the fourth electrical path coupled to a second signal line of the bus and the fourth current element and including a fifth control device coupled for control by the second set of control signals.

14. The system of claim 13, further comprising a sixth control device coupled to the third and fourth current elements, the sixth control device selectively coupling the first and second current elements in response to the driver operating mode.

15. The system of claim 8, further comprising at least one register storing information for use in controlling at least one of the first set and second set of control signals in accordance with the driver operating modes.

16. The system of claim 8, wherein the plurality of driver operating modes also includes a transmit mode and a receive mode.

17. The system of claim 16, wherein the first driver includes first and second electrical paths coupling the first current source and supply rails, the first electrical path comprising a first control device, the second current path comprising a second control device, wherein the first set of control signals couples to the first and second control devices.

18. The system of claim 17, wherein the second driver includes third and fourth electrical paths coupling the second current source and supply rails, the third electrical path comprising a third control device, the fourth electrical path comprising a fourth control device, wherein the second set of control signals couples to the third and fourth control devices.

19. The system of claim 18, wherein the first driver is in transmit mode and the second driver is in receive mode, wherein the first set of control signals include data for transmission to the second driver, wherein the second set of control signals control current flow through the second driver so that one-half of nominal current flow through the second driver is through each of the third and fourth electrical paths.

20. The system of claim 18, wherein the first driver is in receive mode and the second driver is in transmit mode, wherein the second set of control signals include data for transmission to the first driver, wherein the first set of control signals control current flow through the first driver so that one-half of nominal current flow through the first driver is through each of the first and second electrical paths.

21. The system of claim 18, wherein the first driver is in turnaround mode and the second driver is in turnaround mode, wherein the first set of control signals control current flow through the first driver so that one-half of nominal current flow through the first driver is through each of the first and second electrical paths, wherein the second set of control signals control current flow through the second driver so that one-half of nominal current flow through the second driver is through each of the third and fourth electrical paths.

22. A signaling system comprising:
a bidirectional differential bus; and
a plurality of current mode drivers having a plurality of operating modes that time-share use of the bus, each driver including a first electrical path having a first transistor coupled to a first signal path of the bus and at least one current source and a second electrical path having a second transistor coupled to a second signal path of the bus and the current source, wherein control signals couple to control the first and second transistors to selectively couple the current source to the bus to provide uniform current distribution across the bus in each of the operating modes, including a bus turnaround mode.

23. The system of claim 22, wherein the current source comprises a first current source coupled to the first transistor and a second current source coupled to the second transistor.

24. The system of claim 23, further comprising a third transistor selectively coupling the first and second current sources in response to the driver operating modes, wherein the third transistor in response to the control signals couples the first and second current sources in the transmit mode and decouples the first and second current sources in the turnaround mode and the receive mode.

25. The system of claim 24, further comprising at least one register storing information for use in controlling at least one of the first, second and third transistors in accordance with the driver operating modes.

26. The system of claim 22, wherein the driver operating modes include transmit modes during which the control signals couple data signals to the first transistor and data complement signals to the second transistor.

27. The system of claim 22, wherein, during the bus turnaround mode, the control signals cause each of the first and second transistors to be in an on state that results in an approximately equal current distribution through each of the first and second electrical paths and an approximately equal current on the first and second signal paths of the bus.

28. The system of claim 22, wherein the driver operating modes include receive modes during which the control signals cause each of the first and second transistors to be in an on state that results in an approximately equal current distribution through each of the first and second electrical paths and uniform current distribution across the bus.

29. A method for controlling driver devices, comprising:
selecting a transmitter mode by applying data signals to device inputs, wherein data of the data signals is transferred to a bidirectional differential bus according to a time-sharing protocol;
selecting a bus turnaround mode by applying control signals to the device inputs that control an approximately equal current distribution through each of two signal paths of the device and an equivalent current on each signal line of the bus;
selecting a receiver mode by applying the control signals to the device inputs; and
selectively coupling a current source of the device to the bus and providing uniform current distribution across the bus during each of the transmitter, turnaround, and receiver mode.

30. The method of claim 29, wherein the device current source comprises a first current source coupled to a first signal path of the device and a second current source coupled to a second signal path of the device.

31. The method of claim 30, wherein selecting a transmitter mode further comprises coupling the first current source to the second current source.

32. The method of claim 30, wherein selecting a receiver mode further comprises:
isolating the first and second current sources;
coupling the first current source to a first signal line of the bus in response to the control signals; and
coupling the second current source to a second signal line of the bus in response to the control signals.

33. The method of claim 30, wherein selecting a turnaround mode further comprises:
isolating the first and second current sources;
coupling the first current source to a first signal line of the bus in response to the control signals; and
coupling the second current source to a second signal line of the bus in response to the control signals.

34. The method of claim 29, further comprising receiving information of at least one register for use in selecting at least one of the transmitter, turnaround, and receiver mode.

35. The method of claim 29, wherein the driver devices are differential drivers in a signal transfer system.

36. A method comprising:
transmitting and receiving data through an electronic system using a plurality of drivers coupled to a bidirectional differential bus;
controlling an operating mode of the drivers, the operating modes including at least one of a transmit mode, a turnaround mode, and a receive mode; and
selectively coupling current sources of the drivers to the bus during the operating modes and controlling current distribution through electrical paths of the drivers to provide uniform current distribution across the bus during each of the operating modes, the control of current distribution including controlling electrical paths through drivers in the receive mode to provide a constant common mode current offset between signal lines of the bus, and controlling electrical paths through drivers in the turnaround mode to provide approximately equal current on each signal line of the bus.

37. A method for reducing electrical noise during signal transmission, comprising:
receiving data signals at a first driver and transferring data of the data signals to a bidirectional bus, wherein the bus is a time-shared differential bus;
receiving the transferred data at a second driver and using control signals to control current paths through the second driver to provide a constant common mode current offset between signal lines of the bus during transfer of the data;
receiving the control signals at the first driver during a bus turnaround and in response controlling current paths through the first driver to provide approximately equal current on each signal line of the bus;
receiving data signals at the second driver and transferring data of the data signals to the first driver via the bidirectional bus; and
receiving the transferred data at the first driver and using the control signals to control current paths through the first driver to provide a constant common mode current offset between signal lines of the bus during receipt of the data, wherein the first and second drivers provide uniform supply current distribution across the bus during the data transfers and the bus turnaround.

38. A data transfer system comprising:
means for controlling an operating mode of components of the system including drivers coupled to a bidirectional differential bus, the operating modes including at least one of a transmit mode, a turnaround mode, and a receive mode; and
means for selectively coupling a current source of the drivers to the bus during the operating modes and controlling current distribution through electrical paths of the drivers to provide uniform current distribution across the bus during each of the operating modes, the control of current distribution including controlling electrical paths through drivers in the receive mode to provide a constant common mode current offset between signal lines of the bus, and controlling electrical paths through drivers in the turnaround mode to provide approximately equal current on each signal line of the bus.

39. Computer readable medium including executable instructions which when executed in a processing system control driver devices by:
selecting a transmitter mode by applying data signals to device inputs, wherein data of the data signals is transferred to a bidirectional differential bus according to a time-sharing protocol;
selecting a bus turnaround mode by applying control signals to the device inputs that control an approximately equal current distribution through each of two signal paths of the device and an equivalent current on each signal line of the bus;
selecting a receiver mode by applying the control signals to the device inputs; and
selectively coupling a current source of the device to the bus and providing uniform current distribution across the bus during each of the transmitter, turnaround, and receiver mode.

* * * * *

UNITED STATES PATENT AND TRADEMARK OFFICE
CERTIFICATE OF CORRECTION

| | | |
|---|---|---|
| PATENT NO. | : 7,164,292 B2 | Page 1 of 1 |
| APPLICATION NO. | : 10/866157 | |
| DATED | : January 16, 2007 | |
| INVENTOR(S) | : Schmitt et al. | |

It is certified that error appears in the above-identified patent and that said Letters Patent is hereby corrected as shown below:

Claim 1, column 16, line 33, replace "around modes, wherein" with --around mode, wherein--

Signed and Sealed this

Seventeenth Day of April, 2007

JON W. DUDAS
*Director of the United States Patent and Trademark Office*